United States Patent [19]

Berger

[11] Patent Number: 4,463,139

[45] Date of Patent: Jul. 31, 1984

[54] PHOTOCROSSLINKABLE POLYMERS HAVING THIOETHERIMIDYL SIDE GROUPS

[75] Inventor: Joseph Berger, Basel, Switzerland

[73] Assignee: Ciba-Geigy Corporation, Ardsley, N.Y.

[21] Appl. No.: 485,934

[22] Filed: Apr. 18, 1983

[30] Foreign Application Priority Data

Apr. 28, 1982 [CH] Switzerland .................. 2596/82

[51] Int. Cl.$^3$ .............................. C08F 8/30; C08F 8/34
[52] U.S. Cl. ............................ 525/329.1; 525/329.3; 525/329.7; 525/330.3; 525/330.7; 525/331.5; 525/421; 525/437; 525/331.9; 525/333.3
[58] Field of Search ............... 525/437, 417, 326.7, 525/351, 181, 168; 526/262; 528/289

[56] References Cited

U.S. PATENT DOCUMENTS

| | | | |
|---|---|---|---|
| 4,158,730 | 6/1979 | Baumann et al. | 525/417 |
| 4,242,264 | 12/1980 | Zweifel et al. | 526/262 |
| 4,247,660 | 1/1981 | Zweifel et al. | 525/326.7 |
| 4,283,509 | 8/1981 | Zweifel et al. | 526/262 |
| 4,377,669 | 3/1983 | Zweifel et al. | 528/289 |

FOREIGN PATENT DOCUMENTS

| | | | |
|---|---|---|---|
| 0021019 | 7/1981 | European Pat. Off. | 526/262 |
| 0047912 | 8/1981 | European Pat. Off. | 525/348 |

*Primary Examiner*—Joseph L. Schofer
*Assistant Examiner*—Peter F. Kulkosky

*Attorney, Agent, or Firm*—Michael W. Glynn

[57] ABSTRACT

Photocrosslinkable polymers having an average molecular weight of at least 1,000 and side groups of the formula Ia and/or Ib

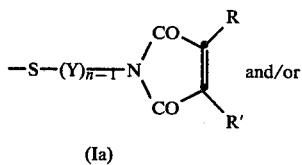

(Ia)

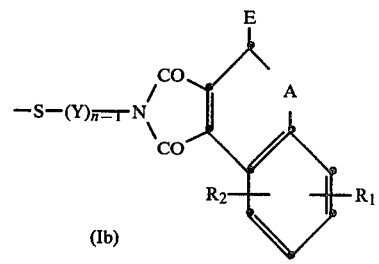

(Ib)

in which R, R', $R_1$, $R_2$, A, E, Y and n are as defined in claim 1, are suitable, for example, for preparing solvent-resistant coatings on metals and, in particular, for preparing printing plates or printed circuits. The group of the formula Ia and/or Ib content is at least 0.5%, preferably 5–100%, based on the number of the polymer's recurring structural elements.

14 Claims, No Drawings

PHOTOCROSSLINKABLE POLYMERS HAVING THIOETHERIMIDYL SIDE GROUPS

The present invention relates to novel photocrosslinkable polymers having thioetherimidyl side groups, to a process for their preparation and to their use in preparing photocrosslinked products. The invention also relates to novel starting materials developed for preparing said polymers.

German Offenlegungsschrift No. 2,626,769 and European patent application published under No. 3552 disclose photocrosslinkable polymers having imidyl side groups, in particular dimethylmaleinimidyl and certain tricyclic imidyl groups.

The invention relates to novel photocrosslinkable polymers which have an average molecular weight of at least 1,000 and side groups of the formula Ia and/or Ib

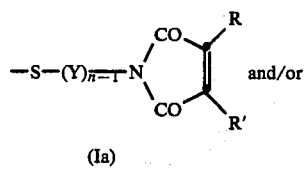
(Ia) and/or

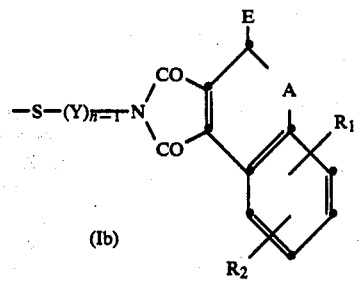
(Ib)

in which R and R' independently of each other are $C_{1-4}$-alkyl or together are unsubstituted or methyl-substituted trimethylene or tetramethylene, $R_1$ and $R_2$ independently of each other are hydrogen, halogen, $C_{1-4}$-alkyl or methoxy, A is —$CH_2$—, —$CH_2CH_2$— or —$OCH_2$— where oxygen is bonded to the aromatic ring and E is hydrogen or A is —O— and E is —$CH_3$—, n is 1 or 2 and Y is —$C_aH_{2a}$— where a=1-12, in particular 2-8, $C_{3-8}$-cycloalkylene, $C_{6-10}$-arylene, $C_{7-8}$-aralkylene or -alkylarylene or

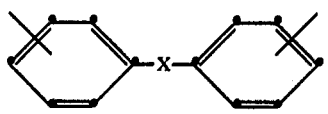

where X is a direct bond, —O—, —S— or —$CH_2$—, and said Y substituents can also be substituted and the group of the formula Ia and/or Ib content is at least 0.5%, based on the number of the polymer's recurring structural elements. Those polymers of the type mentioned are preferred in which the group of the formula Ia and/or Ib content is 5-100%, in particular 10-100%, especially 20-100%, based on the number of the polymer's recurring structural elements.

The polymers of the invention preferably have an average molecular weight of 1,000 to 1,000,000, in particular of 1,000 to 350,000. The average molecular weight of the polymers can be determined by methods known per se, for example by means of light-scattering, vapour pressure osmometry or ultracentrifugation.

Polymers of the invention are, for example, polyesters, polyester amides, polyamides, polyimides, polyamide-imides, polyester-amide-imides, polyethers, polyamines, polyimines, and polyurethanes, and polycondensates, for example novolaks, organopolysiloxanes or polymers which are obtained by homopolymerising or copolymerising dienes such as, for example, butadiene, isoprene, chloroprene or mixtures thereof if desired together with other ethylenically unsaturated monomers, such as acrylic acid, methacrylic acid, acrylates, methacrylates, acrylonitrile, styrene, vinyl acetate and its hydrolysis products, vinyl chloride, vinylidene chloride, vinylidene fluoride or maleic anhydride, for example those synthetic rubbers which are marketed by Goodrich Chem. Corp. under the name Hycar ® (copolymers of butadiene with acrylonitrile or styrene) or the polybutadiene and polyisoprene copolymers described in U.S. Pat. No. 3,862,101.

The polymers of the invention can be prepared by known methods by synthesising macromolecules having photoactive side groups. In principle the following ways are possible:

(1) incorporating imidyl groups of the formulae Ia and Ib in existing polymer chains; and
(2) building the polymer chain by polymerisation, polyaddition or polycondensation from monomers which contain groups of the formula Ia and/or Ib.

Polymers of the invention—as is clear from the general definition—can also be copolymers made up of structural elements having groups of the formula Ia and/or Ib and other structural elements, the various structural elements being present in the copolymer in a random or at least partly block-like arrangement.

The polymers of the invention are preferably prepared by the incorporating method, for example by (a) the addition of a compound of the formula IIa or IIb

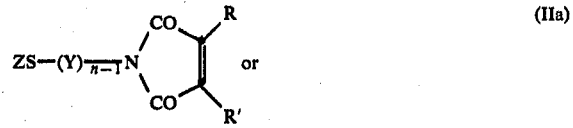
(IIa) or

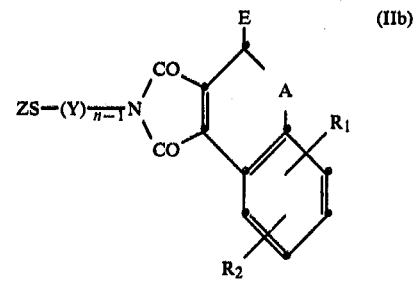
(IIb)

in which R, R', $R_1$, $R_2$, A, E, Y and n are as defined under the formulae Ia and Ib and Z, if n=1, is a halogen atom, such as fluorine, bromine or, in particular, chlorine, and, if n=2, is hydrogen or a halogen atom, such as fluorine, bromine or, in particular, chlorine, onto a polymer having C═C double bonds, in such a way that the ratio of compound of the formula IIa or IIb to the number of C═C double bonds present in the starting polymer is 1:20 to 1:1, in particular 1:10 to 1:1, especially 1:5 to 1:1, or (b) reacting a compound of the formula IIa or IIb where n=2 and Z=hydrogen by condensation or ring-opening addition reactions with polymers having suitable functional groups, such as COOH, COCl, anhydride or

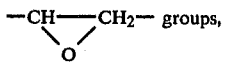

in such a way that the ratio of compound of the formula IIa or IIb to the polymer is 1:20 to 1:1, in particular 1:10 to 1:1, especially 1:5 to 1:1, based on the number of the polymer's recurring structural elements.

It is preferred to use compounds of the formula IIa to IIb in which Z is chlorine if n=1, and especially compounds of the formula IIa or IIb in which n is 2 and Z is hydrogen or chlorine.

A substituted Y group is substituted by, for example, alkyl or alkoxy substituents having 1-4 C atoms, in particular 1 or 2 C atoms, each, nitro groups and especially halogen atoms, such as bromine, fluorine or, in particular, chlorine. A $-C_aH_{2a}-$ Y is a straight-chain or branched radical which is preferably unsubstituted or substituted by halogen atoms, especially chlorine.

The examples of such a radical are ethylene, $-CH(Cl)CH_2-$, 1,3- and 1,2-propylene, 2,2-dimethylpropylene, 1-chloro-1,3-propylene, tetramethylene, hexamethylene, octamethylene, decamethylene and dodecamethylene. A cycloalkylene group Y is in particular a 1,3-cyclopentylene or a 1,3- or especially a 1,4-cyclohexylene group.

A substituted arylene group Y preferably has only one substituent per ring, in particular an alkyl or alkoxy group having 1-4, especially 1 or 2, C atoms each or a nitro group. Examples of arylene groups Y are the 1,2-, 1,3- and 1,4-phenylene group, the 1,3-toluylene group, the 5-methoxy-1,3-phenylene group, the 3-nitro-1,4-phenylene group and the 1,7- and 2,7-naphthylene group. Unsubstituted arylene groups, especially the 1,4- and 1,3-phenylene groups are preferred.

An aralkylene group Y is especially a

and or

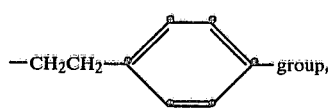

and an alkylarylene group is especially a

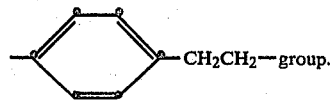

A bicyclic radial Y

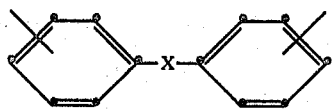

is preferably unsubstituted and bonded in the 4,4'-position.

Alkyl groups R, R', $R_1$ and $R_2$ can also be straight-chain or branched and are, for example, methyl, ethyl, n-propyl, isopropyl, n-butyl or sec.-butyl. A halogen atom $R_1$ or $R_2$ is especially a chlorine, bromine or fluorine atom. Alkyl groups $R_1$ and $R_2$ are advantageously straight-chain and each has 1 to 2 C atoms. However, $R_1$ and $R_2$ are preferably hydrogen.

Preferred polymers have side groups of the formula Ib in which A is $-CH_2-$, E, $R_1$ and $R_2$ are hydrogen, n is 2 and Y is unsubstituted or halogen-, in particular chlorine-, substituted $C_{2-8}$-alkylene or 1,3- or 1,4-phenylene, and are especially those in which n, A, E, $R_1$ and $R_2$ are as preferred above and Y is ethylene, $-CH(Cl)CH_2-$, or 1,3- or 1,4-phenylene. However, particularly preferred polymers have side groupings of the formula Ia in which R and R' are methyl, n is 1 or, in particular, 2 and Y is unsubstituted or halogen-, in particular chlorine-, substituted $C_{2-8}$-alkylene or 1,3- or 1,4-phenylene. Very highly preferred polymers have side groupings of the formula Ia in which R and R' are methyl, n is 2, and Y is ethylene, $-CH(Cl)CH_2-$, or 1,3- or 1,4-phenylene.

Examples of starting polymers which can be reacted with compounds of the formula IIa or IIb are polyacrylic acid, polymethacrylic acid and derivatives thereof, copolymers of these acids and other ethylenically unsaturated monomers, maleic anhydride polymers and copolymers, polymers with reactive chloroalkylene groups, polymers with free glycidyl groups, such as copolymers based on glycidyl acrylate or methacrylate, at least partially unsaturated polyamides, polyesters and polyurethanes, elastomers, such as polybutadiene, polyisoprene, polychloroprene and copolymers of the corresponding dienes with other ethylenically unsaturated comonomers, for example those of the abovementioned type.

Preferred polymers of the invention have recurring structural elements of the formulae III to XVI:

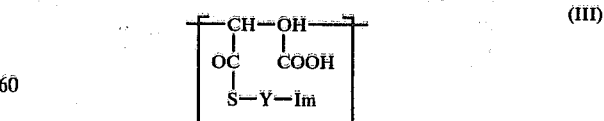

(III)

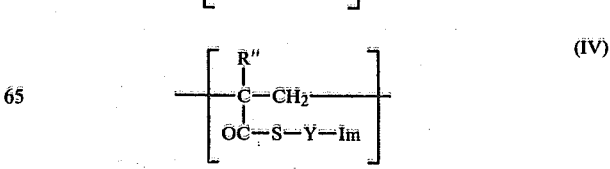

(IV)

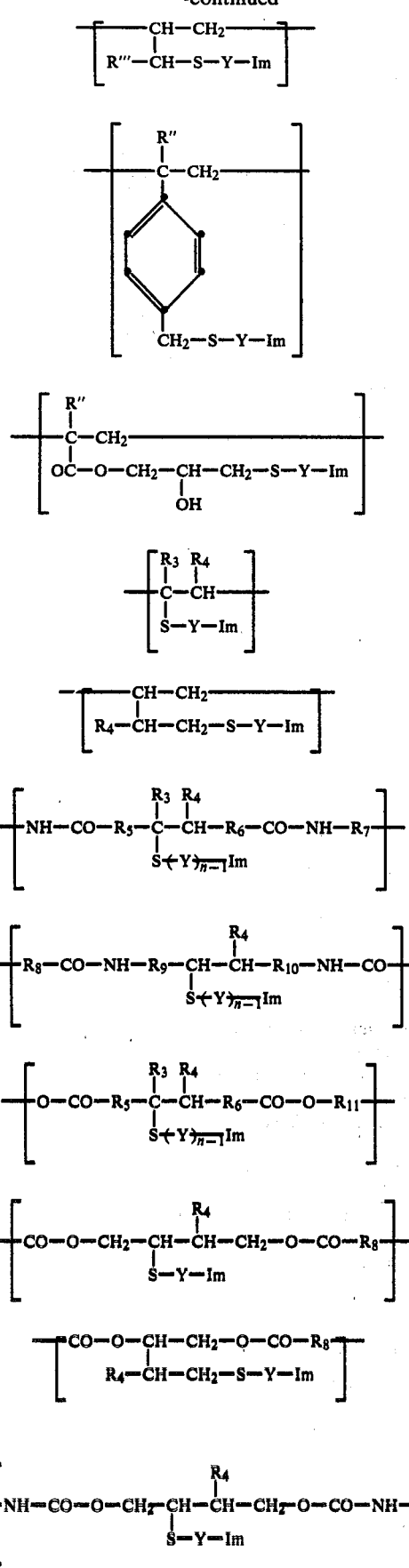

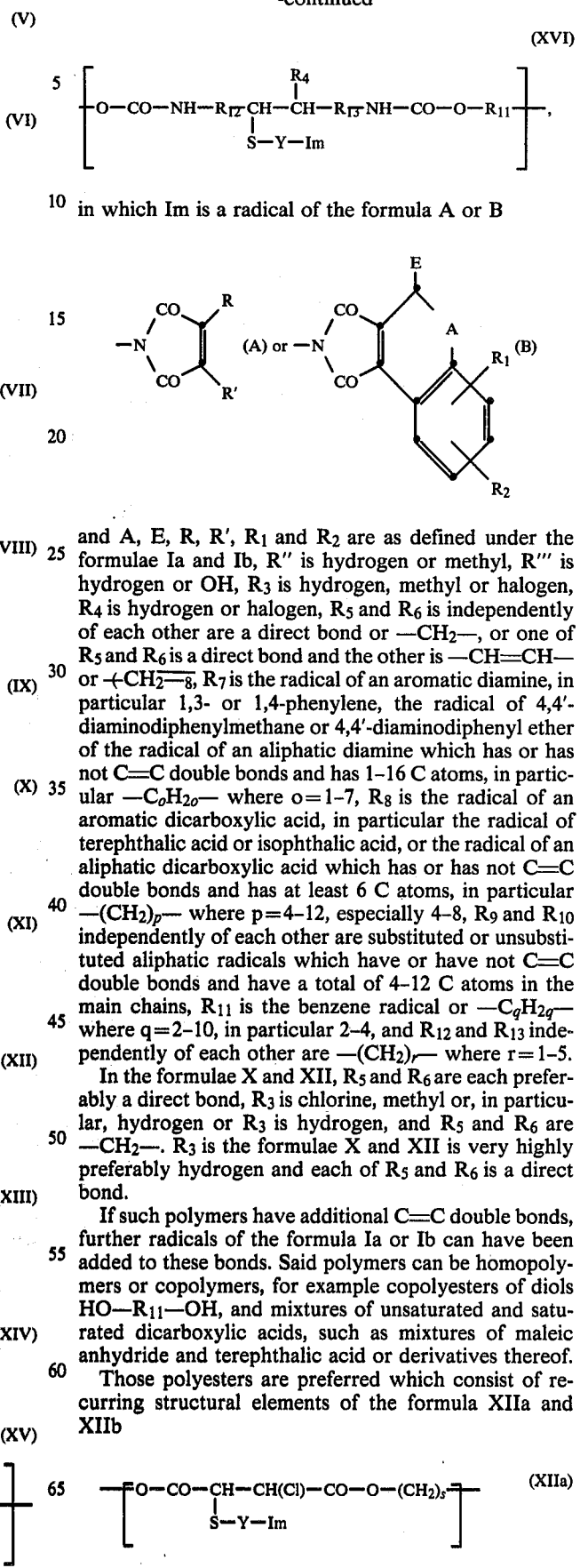

in which Im is a radical of the formula A or B and A, E, R, R', $R_1$ and $R_2$ are as defined under the formulae Ia and Ib, R" is hydrogen or methyl, R''' is hydrogen or OH, $R_3$ is hydrogen, methyl or halogen, $R_4$ is hydrogen or halogen, $R_5$ and $R_6$ is independently of each other are a direct bond or —CH$_2$—, or one of $R_5$ and $R_6$ is a direct bond and the other is —CH=CH— or $+CH_2\overline{)_{=8}}$, $R_7$ is the radical of an aromatic diamine, in particular 1,3- or 1,4-phenylene, the radical of 4,4'-diaminodiphenylmethane or 4,4'-diaminodiphenyl ether of the radical of an aliphatic diamine which has or has not C=C double bonds and has 1–16 C atoms, in particular —$C_oH_{2o}$— where o=1–7, $R_8$ is the radical of an aromatic dicarboxylic acid, in particular the radical of terephthalic acid or isophthalic acid, or the radical of an aliphatic dicarboxylic acid which has or has not C=C double bonds and has at least 6 C atoms, in particular —(CH$_2$)$_p$— where p=4–12, especially 4–8, $R_9$ and $R_{10}$ independently of each other are substituted or unsubstituted aliphatic radicals which have or have not C=C double bonds and have a total of 4–12 C atoms in the main chains, $R_{11}$ is the benzene radical or —$C_qH_{2q}$— where q=2–10, in particular 2–4, and $R_{12}$ and $R_{13}$ independently of each other are —(CH$_2$)$_r$— where r=1–5.

In the formulae X and XII, $R_5$ and $R_6$ are each preferably a direct bond, $R_3$ is chlorine, methyl or, in particular, hydrogen or $R_3$ is hydrogen, and $R_5$ and $R_6$ are —CH$_2$—. $R_3$ is the formulae X and XII is very highly preferably hydrogen and each of $R_5$ and $R_6$ is a direct bond.

If such polymers have additional C=C double bonds, further radicals of the formula Ia or Ib can have been added to these bonds. Said polymers can be homopolymers or copolymers, for example copolyesters of diols HO—$R_{11}$—OH, and mixtures of unsaturated and saturated dicarboxylic acids, such as mixtures of maleic anhydride and terephthalic acid or derivatives thereof.

Those polyesters are preferred which consist of recurring structural elements of the formula XIIa and XIIb

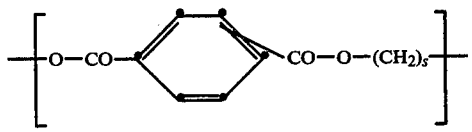

where Y is 1,3- or 1,4-phenylene, ethylene or, in particular, —CH(Cl)CH₂—, Im is a radical of the formula (B) where A=—CH₂— and E, R₁ and R₂=hydrogen or especially a radical of the formula (A) where R and R'=methyl and s is a number between 2 and 12. The grouping of the formula Ia or Ib content is preferably 60–100% based, on the number of C=C double bonds present in the starting polymer.

Those polyamides are particularly preferred which consist of recurring structural elements of the formulae XIa, XIb and/or XIc phthalic acid and/or of a saturated aliphatic dicarboxylic acid having 6–10 C atoms.

Those polyamides are very particularly preferred which consist of recurring structural elements of the formulae XIa, XIb and/or XIc in which $Q_1$ and $Q_2$ are methyl, $Q_3$ is isopropyl, $Q_4$ is hydrogen, $R_4$ is chlorine, $R_8$ is the radical of terephthalic acid, isophthalic acid and/or adipic acid, especially those in which $Q_1$ and $Q_2$ are methyl, $Q_3$ is isopropyl, $Q_4$ is hydrogen and $R_8$ is the radical of terephthalic acid and/or the radical of adipic acid, while n is preferably 2, Y is ethylene, 1,3- or 1,4-phenylene or, in particular —CH(Cl)CH₂—, and Im is a radical of the formula (B) in which A is —CH₂— and E, R₁ and R₂ are hydrogen, but in particular a radical of the formula (A) in which R and R' are methyl.

Also those polymers are preferred which consist of recurring structural elements of the formula VIII and/or IX, especially those in which $R_4$ is chlorine, $R_3$ is hydrogen, Y is ethylene, —CH(Cl)CH₂— or, in particular, 1,3- or 1,4-phenylene and Im is a radical of the for-

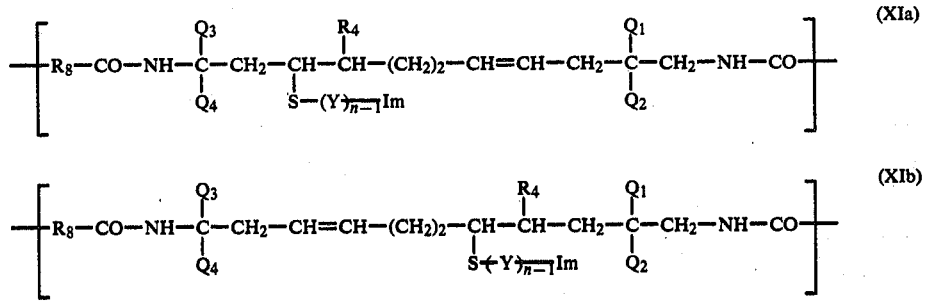

and/or

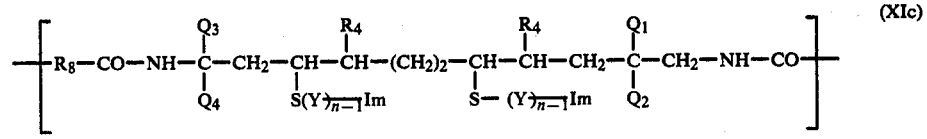

in which $Q_1$ is $C_{1-12}$-alkyl, $Q_2$ is hydrogen or $C_{1-12}$-alkyl, $Q_3$ is $C_{1-12}$-alkyl, cycloalkyl having 4–12 ring C atoms, aralkyl having 7 or 8 C atoms or substituted or unsubstituted aryl and $Q_4$ is hydrogen, $C_{1-12}$-alkyl, cycloalkyl having 4–12 ring C atoms, aralkyl having 7 or 8 C atoms or substituted or unsubstituted aryl or $Q_1$ and $Q_2$ and/or $Q_3$ and $Q_4$ together are alkylene having 3–11 C atoms, $R_4$ is as defined above and is, in particular, chlorine and $R_8$ is the radical of terephthalic acid, isophthalic acid and/or of a saturated aliphatic dicarboxylic acid having 6–12 C atoms.

The unsaturated diamines on which these polyamides are based can be obtained from the corresponding oximes described in U.S. Pat. No. 4,277,621, by reducing these oximes or by dehydrating them and reducing the nitriles.

Preferably $Q_1$ is $C_{1-5}$-alkyl, $Q_2$ is hydrogen or $C_{1-5}$-alkyl or $Q_1$ and $Q_2$ together are alkylene having 4–7 C atoms, $Q_3$ is $C_{1-7}$-alkyl, $C_{5-8}$-cycloalkyl or unsubstituted phenyl, in particular $C_{1-5}$-alkyl or unsubstituted phenyl, and $Q_4$ is hydrogen or $C_{1-5}$-alkyl, in particular hydrogen or methyl.

Particularly preferably $Q_1$ is methyl or ethyl, $Q_2$ is hydrogen, methyl or ethyl, $Q_3$ is $C_{1-5}$-alkyl or unsubstituted phenyl and $Q_4$ is hydrogen or methyl, $R_4$ is chlorine and $R_8$ is the radical of terephthalic acid, isomula (B) where A=—CH₂— and E, R₁ and R₂=hydrogen or especially a radical of the formula (A) where R and R'=methyl, and the grouping of the formula Ia or Ib content is preferably 60–100%, based on the number of C=C double bonds present in the starting polymer.

Polymers having recurring structural elements of the formulae III to VII can be obtained by reacting compounds of the formula IIa or IIb where n=2 and Z=H with polymers having suitable functional groups, for example those of the formulae IIIa, IVa, Va, Vb, VIa or VIIa

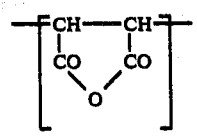 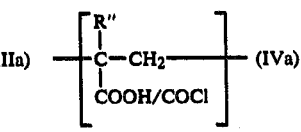

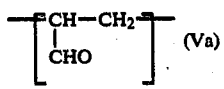 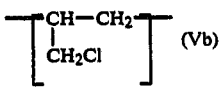

-continued

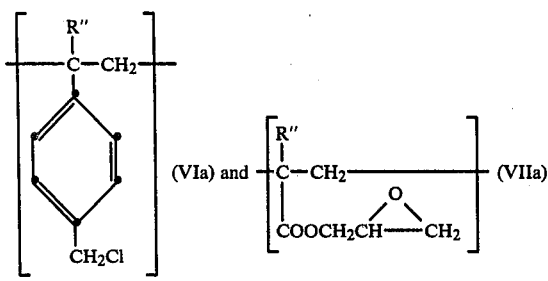

where R" and R'" are as defined above.

Polymers having recurring structural elements of the formulae VIII to XVI can be obtained by the addition of compounds of the formula IIa or IIb where $n=1$ or 2 and $Z=$hydrogen or halogen, in particular chlorine, onto polymers having recurring structural elements of the following formulae

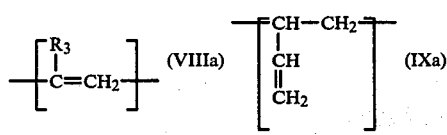

for example 1,4-polybutadiene, polychloroprene, polyisoprene or 1,2-polybutadiene

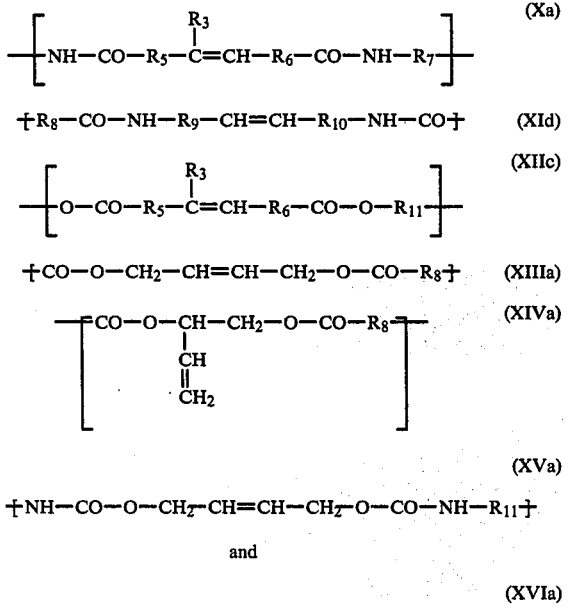

In these formulae, $R_3$ and $R_6$ to $R_{13}$ are as defined above. The starting polymers are known or can be prepared by methods which are known per se.

Compounds of the formula IIa or IIb can be incorporated in existing polymers in a manner known per se. The addition of compounds of the formula IIa or IIb in which Z is halogen onto polymers having C=C double bonds is advantageously carried out at temperatures between $-20°$ C. and $+50°$ C., preferably 0° to 30° C., in suitable inert organic solvents with the exclusion of moisture. The addition of compounds of the formula IIa or IIb where $n=2$ and $Z=H$ onto polymers having C=C double bonds is also advantageously carried out at temperatures between 50° and 150° C., preferably 70° to 90° C., in an inert organic solvent in an inert gas atmosphere, such as nitrogen. This reaction proceeds via free radicals and is therefore carried out in the presence of free-radical initiators. Examples of solvents suitable for these addition reactions are aromatic or aliphatic hydrocarbons, such as benzene, toluene, chlorobenzene, dichlorobenzene, chloroform or carbon tetrachloride, and cyclic or aliphatic amides, such as N-methyl-2-pyrrolidone, N-ethyl-2-pyrrolidone, N-methyl-ε-caprolactam, N,N-dimethylformamide, N,N-dimethylacetamide or N,N-diethylacetamide. The free-radical initiators used can be compounds known per se, dibenzoyl peroxide and α,α'-azoisobutyronitrile being preferred.

The incorporation of compounds of the formula IIa or IIb where $n=2$ and $Z=H$ in polymers having suitable functional groups by means of condensation or ring-opening addition reactions is also preferably carried out in an inert organic solvent or solvent mixture, in the case of condensation reactions preferably at temperatures of $-20°$ C. to $+100°$ C. Ring-opening addition reactions are advantageously carried out at elevated temperatures, generally at temperatures between 80° and 120° C. or at the reflux temperature. Examples of solvents suitable for these reactions are aliphatic or cyclic ketones, such as acetone, methyl ethyl ketone, cyclohexanone or cyclopentanone, cyclic ethers, such as tetrahydrofuran or dioxane, cyclic or aliphatic amides, such as N-methyl-2-pyrrolidone, N-methyl-ε-caprolactam, N,N-dimethylformamide, N,N-dimethylacetamide or N,N-diethylacetamide, and dialkyl sulfoxides, such as dimethyl sulfoxide or diethyl sulfoxide.

After the reaction the polymers modified with imidyl groups of the type defined can be precipitated in suitable precipitating agents, such as diethyl ether, di-n-propyl ether, methanol, ethanol, isopropanol, n-pentane, n-hexane, benzene or toluene.

Polymers of the invention can also be obtained by the addition of compounds of the formula IIa or IIb where $Z=H$ or halogen ($n=2$) onto acetylene and copolymerising the monomers thus obtained, if desired in the presence of other ethylenically unsaturated monomers, such as acrylic acid or methacrylic acid or their esters, vinyl acetate or maleic anhydride. Compounds of the formula IIa or IIb where $Z=H$ can also be added onto, for example, unsaturated dicarbonyl halides and the resulting compounds reacted with suitable co-condensation components, such as diamines or diols.

The invention also relates to those starting materials of the formula IIa and IIb which are novel, the preferred definitions for R, R', $R_1$, $R_2$, A, E, n and Y given above also being applicable here. They can be prepared by methods known per se, for example by reacting an anhydride of the formula XvIIa or XvIIb ($n=2$)

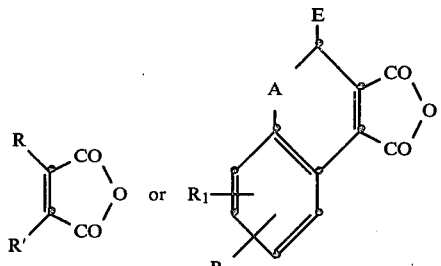

(XVIIa) (XVIIb)

with a compound of the formula XVIII $$H_2N-Y-SH \qquad (XVIII)$$

and treating the resulting mercapto compounds, if desired with elemental halogen, especially $Br_2$ or $Cl_2$. Compounds of the formula IIa or IIb where $n=1$ can be obtained by treating a compound of the formula XIxa or XIxb

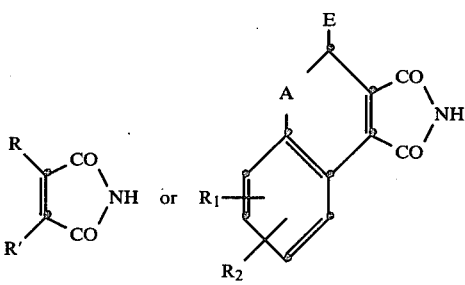

(XIXa) (XIXb)

with an S-halogen-introducing agent, such as sulfur dichloride, sulfur dibromide or sulfur tetrafluoride, if desired in the presence of an acid acceptor, such as pyridine or triethylamine, while R, R', $R_1$, $R_2$, A, E and Y are as defined under the formulae Ia and Ib.

The above reactions are preferably carried out in the presence of an inert organic solvent. Examples of such solvents suitable for the reaction of anhydrides of the formulae XVIIa and XVIIb with aminothiols of the formula XVIII are aromatic hydrocarbons, such as benzene or toluene.

The reaction of mercapto compounds with elemental halogen as well as the reaction of the compounds of the formulae XIXa and XIXb with the S-halogen-introducing agent is advantageously carried out in a halogenated aliphatic or aromatic hydrocarbon, such as carbon tetrachloride, carbon tetrabromide, dichloromethane, chloroform or dichlorobenzene.

Polymers of the invention can be photocrosslinked, and are suitable, for example, for preparing solvent-resistant coatings on various materials, especially metals, such as aluminium, copper or steel, or for preparing printing plates for offset printing, fir preparing photo-offset coatings, for unconventional photography, for example for preparing photographic images by means of photocrosslinking. They are preferably used for preparing offset printing plates or as photoresist materials for preparing printed circuits by methods known per se. In the latter application, that side of the circuit board which bears the light-sensitive layer is subjected to exposure through a photomask showing the conductor layout and then developed, whereupon the unexposed parts of the layer are removed by the developing liquid. The exposure can be carried out with, for example, sunlight, carbon arcs or xenon lamps. The exposure is advantageously carried out with high pressure mercury lamps. The carrier materials can be coated with the light-sensitive polymers by conventional techniques, for example by dipping or spray-, whirler-, cascade-, knife-, curtain- or roller-coating.

Crosslinked products which can be obtained with the novel polymers, in particular polyamides, are distinguished by good solvent resistance, substantial abrasion resistance, and firm adhesion to carrier materials, in particular metals, combined with high light-sensitivity. In the uncrosslinked state the polymers are more soluble than comparable polymers without imidyl side groups of the type defined in various solvents, such as methanol, ethanol, chloroform or N,N-dimethylformamide.

EXAMPLE 1

124.6 g (0.988 mol) of dimethylmaleic anhydride and 80 g (1.037 mols) of 2-mercaptoethylamine are dispersed in 1,150 ml of toluene. The water formed is separated off at refluxing toluene. After cooling down, the clear solution is extracted three times with 300 g of water each time, the aqueous phase is separated off, and the toluene solution is dried over $CaCl_2$ and distilled. N-(2-Mercaptoethyl)-dimethylmaleinimide passes over at 94° C./1 Pa.

Yield: 120 g (65.6% of theory).
Elemental analysis: calculated: C 51.87, H 5.99, N 7.56, S 17.31%, found: C 51.83, H 5.94, N 7.51, S 16.92%.

NMR spectrum: δ(ppm):

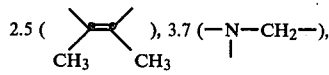

2.7 (—$CH_2$—S—) and 1.4 (S—H).

A 1,000 ml sulfonating flask which is equipped with a $Cl_2$ inlet tube, a stirrer, a $CaCl_2$ tube and a dropping funnel is charged with 400 ml of $CCl_4$ and saturated at 20° C. with $Cl_2$. The solution is cooled down to 0°–5° C., and a solution of 29.5 g of N-(2-mercaptoethyl)-dimethylmaleinimide in 250 ml of $CCl_4$ is added dropwise in the course of 30 minutes while the $Cl_2$ stream continues. $Cl_2$ is passed in at 5° C. for 30 minutes and then at 20° C. for a further 2 hours. The solvent is drawn off until constant weight. This gives 46 g of the sulfenyl chloride of N-(2-mercaptoethyl)-dimethylmaleinimide, of the formula

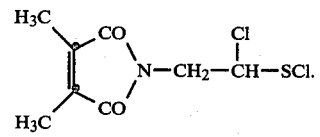

NMR spectrum δ(ppm):

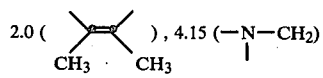

and 5.6 (1H, —CH(Cl)—S—).

EXAMPLE 2

94.6 g (0.75 mol) of dimethylmaleic anhydride and 93.9 g (0.75 mol) of 4-aminothiophenol are dispersed in 750 ml of toluene, the dispersion is heated to the reflux temperature and the dispersed starting materials become dissolved in the toluene. 9 ml of water are separated off in the course of 130 hours of refluxing. The toluene is then drawn off, and the N-(4-mercaptophenyldimethyl)-maleinimide distils over at 155°–160° C./13 Pa.

Yield: 91.0 g (52.0% of theory); melting point: 124°–126° C.).

Elemental analysis: calculated: C 61.80, H 4.72, N 6.01, S 13.73%, found: C 61.75, H 4.81, N 5.95, S 13.65%.

A 1,000 ml sulfonating flask which is equipped with a $Cl_2$ inlet tube, a stirrer, a $CaCl_2$ tube, a reflux condenser and a dropping funnel is charged with 500 ml of $CCl_4$. $Cl_2$ is passed in at 0°–5° C. for 15 minutes. While the $Cl_2$ stream continues, a solution of 28.0 g of N-(4-mercaptophenyl)-dimethylmaleinimide in 300 ml of $CCl_4$ is added dropwise in the course of 90 minutes. $Cl_2$ is then passed in for a further hour. Complete removal of the solvent gives 28.0 g (87.1% of theory) of the sulfenyl chloride of N-(4-mercaptophenyl)-dimethylmaleinimide which can be used without further purification.

Elemental analysis: calculated: C 53.83, H 3.76, N 5.23, Cl 13.24, S 11.97%, found: C 53.70, H 3.83, N 5.46, Cl 13.76, S 11.47%.

EXAMPLE 3

11.3 g (0.0565 mol) of 3,4-dihydronaphthalene-1,2-dicarboxylic anhydride [prepared in accordance with Org. Syntheses, Col. Vol. 2, 194 (1943)] and 4.36 g of 2-mercaptoethylamine (0.0565 mol) are dispersed in 500 ml of toluene. The dispersion is heated to the reflux temperature. About 1 ml of water is separated off in the course of 40 hours of refluxing. The toluene is distilled off in vacuo, the precipitated product is dissolved in 100 ml of $CHCl_3$ and the solution is extracted four times with 150 ml of 1% HCl each time. The $CHCl_3$ phase is then washed twice with 200 ml of water each time, dried over calcium chloride and evaporated. This gives 14.2 g (96.9% of theory) of N-(2-mercaptoethyl)-3,4-dihydronaphthalene-1,2-dicarboximide. All steps are carried out under yellow lighting.

Elemental analysis: calculated: C 64.86, H 5.02, N 5.41, S 12.36%, found: C 64.70, H 4.90, N 5.31, S 12.22%.

14 g (0.054 mol) of N-(2-mercaptoethyl)-3,4-dihydronaphthalene-1,2-dicarboximide are added dropwise at 0°–5° C. in the course of 70 minutes together with a $Cl_2$ stream to 500 ml of $CCl_4$ which has been saturated with chlorine. After the addition has ended, chlorine is passed in for a further hour. The solvent is then removed and the resulting compound of the formula

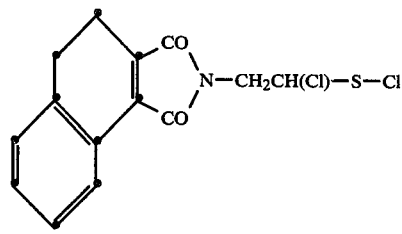

is dried at 50° C./1700 Pa. All steps are carried out under yellow lighting. Yield: 20.0 g.

NMR Spectrum δ (ppm): 4.15

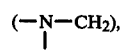

5.6 (1H, —CH(Cl)—S—).

The above sulfenyl chloride is used without further purification as a starting material in the reaction with unsaturated polymers (cf. Example 21).

EXAMPLE 4

10.5 g (0.084 mol) of dimethylmaleinimide are dissolved in 45 ml of $CH_2Cl_2$, and the solution is cooled down to −10° C. 11.2 g (0.109 mol) of freshly distilled $SCl_2$ are then added. 7.3 g (0.092 mol) of pyridine are added dropwise at 0°–10° C. to the resulting orange solution, and the reaction mixture is stirred at 25° C. for 4 hours. The precipitated product is filtered off, and the filtrate is concentrated to dryness and dried. This gives 14.1 g (87.7% of theory) of the sulfenyl chloride of dimethylmaleinimide.

Elemental analysis: calculated: H 3.16, N 7.31, Cl 18.50, S 16.73%, found: H 3.75, N 7.90, Cl 16.90, S 15.90%.

EXAMPLES 5–15

A 100 ml sulfonating flask which is equipped with a nitrogen inlet and outlet, a stirrer, a thermometer, a reflux condenser and a dropping funnel is charged with 5% solutions in dry chloroform of each of the unsaturated polyamides shown in Table 1, below. A 20% chloroform solution of the sulfenyl chloride of Example 1 is then added dropwise with thorough stirring at 20° C. in the course of 30 minutes, during which the temperature rises to 25°–30° C. The solution is kept under nitrogen for 16 hours and is then concentrated to one third of its original volume. The resulting polymer is precipitated in 1 liter of diethyl ether and is dried at 40° C. in a high vacuum.

The following unsaturated polyamides are used:
(a) polyamide of adipic acid and 2,2-dimethyl-11-isopropyl-1,11-diaminoundeca-4,8-diene (DUD);
(b) polyamide of terephthalic acid and DUD; and
(c) copolyamide of terephthalic acid (80 mol%), adipic acid (20 mol%) and DUD.

TABLE 1

| Example No. | Starting polyamide | | | | Sulfenyl-chloride | Converted polyamide | | | |
|---|---|---|---|---|---|---|---|---|---|
| | Type | Amount g | η red[1] (dl/g) | Tg °C. | g | % of converted double bonds | Tg °C. | η red.[1] (dl/g) | Yield g |
| 5 | a | 4 | 0.90 | +41 | 1.54 | 26.7 | −3 | 0.40 | 4.97 |
| 6 | a | 3.6 | 0.90 | +41 | 1.80 | 31.4 | +6 | 0.19 | 5.40 |
| 7 | a | 3.6 | 0.90 | +41 | 2.50 | 51.1 | +10 | 0.20 | 6.53 |
| 8 | a | 4 | 0.90 | +41 | 3.02 | 56.4 | +31 | 0.19 | 7.59 |
| 9 | a | 4 | 0.90 | +41 | 5.91 | 83.7 | +44 | 0.15 | 9.33 |

TABLE 1-continued

| Example No. | Starting polyamide Type | Amount g | $\eta$ red[1] (dl/g) | Tg °C. | Sulfenyl-chloride g | Converted polyamide % of converted double bonds | Tg °C. | $\eta$ red.[1] (dl/g) | Yield g |
|---|---|---|---|---|---|---|---|---|---|
| 10 | a | 3.6 | 0.90 | +41 | 6.43 | 86.3 | +60 | 0.14 | 8.54 |
| 11 | a | 3.6 | 0.90 | +41 | 9.25 | 95 | +70 | 0.13 | 9.04 |
| 12 | a | 5 | 0.55 | +31 | 18.0 | 100 | +74 | — | 12.55 |
| 13 | b | 15.0 | 0.23 | +108 | 33.9 | about 100 | +105 | 0.15 | 37.0 |
| 14 | b[2] | 10.0 | 0.78 | +115 | 22.6 | about 100 | +106 | 0.13 | 26.5 |
| 15 | c | 10.0 | 0.72 | +105 | 22.9 | about 100 | +102 | 0.22 | 25.5 |

[1]Measured on 0.5% solutions in m-kresol at 25° C.
[2]Reaction in a chloroform suspension of the polyamide, which becomes dissolved in the course of the reaction

EXAMPLE 16

10 g of a polyester of 1,3-propylene glycol, maleic anhydride and phthalic anhydride (5.46% by weight of C=C double bonds) which has a Tg of 25° C. and a viscosity of 1000 mPa s at 20° C. are dissolved in 130 ml of CHCl$_3$, are reacted with 14 g of the sulfenyl chloride of Example 1 and worked up, the latter two steps being carried out as described in Example 5. Yield: 11.5 g. Elemental analysis of the product obtained: N 1.56%, S 3.10%; Tg=17° C. Conversion with sulfenyl chloride: about 80% of the C=C double bonds present.

EXAMPLE 17

4.8 g (0.089 mol) of polybutadiene [36% of cis-1,4, 54% of trans-1,4; and 10% of 1,2-vinyl; average molecular weight $\overline{M}_w=0.23\times 10^6$; $\overline{M}_w/\overline{M}_n=1.9$] are dissolved in 360 g of dry toluene and reacted with 22.5 g of the sulfenyl chloride of Example 1 in the manner described in Example 5. The resulting polymer is also worked up as described in Example 5. Yield: 24 g; Tg=23° C. Elemental analysis: N 4.5%, S 8.3%, Cl 21.5%.

EXAMPLE 18

5.0 g (0.0138 mol) of a polyamide of adipic acid and 2,2-dimethyl-11-isopropyl-1,11-diaminoundeca-4,8-diene are dissolved in 68 ml of dry chloroform, and the solution is poured into a 300 ml sulfonating flask which is equipped with a nitrogen inlet and outlet, a stirrer, a thermometer, a reflux condenser and a dropping funnel. A solution of 11.1 g (0.0414 mol) of the sulfenyl chloride of N-(4-mercaptophenyl)-dimethylmaleinimide in 51 ml of CHCl$_3$ is then slowly added dropwise at 20° C. with vigorous stirring, and the reaction mixture is left to stand for 16 hours under nitrogen. The polymer is precipitated in 2 liters of dry diethyl ether and dried at 20° C. for 24 hours in a high vacuum.

Yield: 10.7 g (86.4% of theory).
Elemental analysis: C 61.83%, H 6.45%, N 6.31%, S 6.39%, Cl 6.17%.
$\eta_{red}=0.39$ dl/g (0.5% solution in m-kresol at 25° C.); Tg=69° C.
Conversion of double bonds=66.0%.

EXAMPLE 19

3 g (0.0555 mol) of polybutadiene (36% of cis-1,4, 54% of trans-1,4, and 10% of 1,2-vinyl; $\overline{M}_w=0.23\times 10^6$, $\overline{M}_w/\overline{M}_n=1.9$) are dissolved in 197 g of dry toluene and reacted with 13.4 g (0.050 mol) of the sulfenyl chloride of N-(4-mercaptophenyl)-dimethylmaleinimide in the manner described in Example 18. The resulting polymer is also worked up as described in Example 18. Yield: 15.0 g (91.5% of theory).
Elemental analysis: C 64.31%, H 5.72%, N 3.73%, S 8.40%, Cl 9.34%.

$\eta_{red}=1.86$ dl/g (0.5% solution in m-kresol at 25° C.; Tg=49° C. Conversion of double bonds: 85.1%.

EXAMPLE 20

5 g (0.0138 mol) of the polyamide described in Example 17 and 10.2 g (0.0552 mol) of N-(2-mercaptoethyl)-dimethylmaleinimide are dissolved in 75 ml of N,N-dimethylformamide, and the solution is poured into a 300 ml sulfonating flask which is equipped with a nitrogen inlet and outlet, a thermometer, a stirrer and a reflux condenser. A solution of 13.3 g of dibenzoyl peroxide in 150 ml of N,N-dimethylformamide is added dropwise at 80° C. in the course of 6 hours, and the reaction mixture is held at the same temperature for a further 15 hours. The polymer is then precipitated in a 20-fold excess of diethyl ether and dried at 20° C. in a high vacuum. Yield: 3.8 g; Tg=11° C.; $\eta_{red.}=0.45$ dl/g (0.5% solution in m-kresol at 25° C.). Elemental analysis: S 1.79% (at 100% conversion theoretically 8.75%). This corresponds to 20% conversion of the C=C double bonds of the polyamide with the mercapto compound.

EXAMPLE 21

A solution of 8.1 g (0.0276 mol) of the sulfenyl chloride of Example 3 is added dropwise in the course of 60 minutes at 20° C. under nitrogen to a solution of 5 g (0.0138 mol) of a polyamide of adipic acid and 2,2-dimethyl-11-isopropyl-1,11-diaminoundeca-4,8-diene in 68 mols of chloroform. After 5 hours of reaction the polymer is precipitated in 3 liters of diethyl ether, filtered off and dried at 20° C. in a high vacuum. All steps are carried out under yellow lighting. This gives 7.8 g (59.5% of theory) of polymer. From S and Cl analysis the conversion of the C=C double bonds of the starting polymer is calculated as about 80%.

Elemental analysis: C 60.20%, H 6.9, N 6.0, S, 4.87, Cl 11.60%.

EXAMPLE 22

A solution of 13 g (0.0678 mol) of the sulfenyl chloride of Example 4 in 50 ml of chloroform is added dropwise at 20° C. in the course of 50 minutes under nitrogen to a solution of 5 g (0.0138 mol) of a polyamide of adipic acid and 2,2-dimethyl-11-isopropyl-1,11-diaminoundeca-4,8-diene in 68 ml of chloroform. After 15 hours of reaction the resulting polymer is precipitated in 3 liters of diethyl ether and dried at 20° C. in a high vacuum; $\eta_{red.}=0.49$ dl/g (0.5% solution in m-kresol at 25° C.). Yield: 9.9 g.

Elemental analysis: C 49.16, H 5.90, N 8.20, S 7.50, Cl 14.47%.

EXAMPLES 23-26

A polybutadiene as in Example 19 is reacted with the sulfenyl chloride of N-(4-mercaptophenyl)-dimethylmaleinimide as described in Example 19. The following Table shows the ratios, elemental analysis, Tg and $\eta_{red}$.

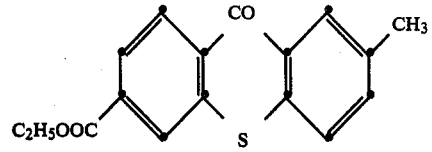

| Example No. | Amount of polybutadiene (g) | Sulfenyl chloride (g) | Converted polybutadiene | | | | | |
|---|---|---|---|---|---|---|---|---|
| | | | Yield (g) | Elemental analysis (%) | | | Tg (°C.) | $\eta$ red[1] (dl/g) |
| | | | | N | S | Cl | | |
| 23 | 3.00 | 0.17 | 3.01 | <0.3 | 0.60 | 0.70 | −84.6 | 3.48 |
| 24 | 3.00 | 0.41 | 3.12 | 0.60 | 1.25 | 1.50 | −79.4 | 3.42 |
| 25 | 3.00 | 0.83 | 3.63 | 0.98 | 2.37 | 2.74 | −68.9 | 3.03 |
| 26 | 3.00 | 1.67 | 4.32 | 1.72 | 4.08 | 4.57 | −48.1 | 2.75 |

[1]On a 0.5% toluene solution at 25° C.

EXAMPLE 27

Reaction of an unsaturated polyester of maleic anhydride and bis-hydroxymethylcyclohexane with the sulfenyl chloride of N-(4-mercaptophenyl)-dimethylmaleinimide.

3 g of the polyester (elemental analysis: C 64.15% (calculated 64.27%), H 7.01% (calculated 7.19), $\eta_{red}$=0.92 dl/g on a 0.5% m-kresol solution at 25° C.) are dissolved in 100 ml of chloroform. 3.58 g of the sulfenyl chloride of N-(4-mercaptophenyl)-dimethylmaleinimide are added dropwise in the course of 30 minutes, and the mixture is left to stand at 20° C. for 48 hours. The solution is then concentrated, and the polymer is precipitated in methanol and dried in vacuo. Yield: 1.88 g.

Analytical data: Tg=16.6° C., $\eta_{red}$=0.07 dl/g (0.5% m-kresol solution at 25° C.), elemental analysis: C 58.0% (calculated 58.59%), H 5.20% (calculated 5.33%), N 2.5% (calculated 2.85%), S 6.05% (calculated 6.52%), Cl 7.0% (calculated 7.21%). The calculated values are based on 100% conversion of the polymer double bonds with the sulfenyl chloride.

EXAMPLE 28

Reaction of an unsaturated polyester of 2-butene-1,4-diol and adipic acid with the sulfenyl chloride of N-(4-mercaptophenyl)-dimethylmaleinimide.

3 g of polyester ($\eta_{red}$=0.32 dl/g on a 0.5% m-kresol solution at 25° C., Tg=−5° C., Tm=+62° C.) are dissolved in 100 ml of dry chloroform. 4.05 g of the sulfenyl chloride of N-(4-mercaptophenyl)-dimethylmaleinimide in 60 ml of chloroform are added dropwise in the course of 20 minutes, and the solution is left to stand at 20° C. for 48 hours and then reduced to ⅓ of its original volume. The polymer is pecipitated with ether and dried at 20° C. in vacuo. Yield: 5.63 g.

Analytical data: Tg=34.1° C. $\eta_{red}$=0.12 dl/g (0.5% solution of m-kresol at 25° C.), elemental analysis: C 56.6% (calculated 56.71%), H 5.4% (calculated 5.19%), N 2.7% (calculated 3.01%), S 6.3% (calculated 6.88%), Cl 7.7% (calculated 7.61%). The calculated values are based on 100% conversion of the polymer double bonds with the sulfenyl chloride.

USE EXAMPLES

EXAMPLE I 1 g of each of the polymers given in Table II, below, and 50 mg of the compound of the formula are dissolved in 5.4 ml of each of the solvents likewise given in Table II. The solutions are applied with a 50 μm doctor blade onto a copper conductor board and dried at 100° C. for 3 minutes.

The coatings are exposed through a Stouffer 21 step sensitivity guide with a 5000 W high-pressure mercury lamp a distance of 70 cm away from the vacuum table, and then developed.

TABLE II

| Polymer of Example | Exposure time (seconds/2000W) | Developed In | Time (secs.) | Last step reproduced on the sensitivity guide |
|---|---|---|---|---|
| 9-12 | 20 | CHCl₃ | 60 | 5-7 |
| 9-12 | 30 | CHCl₃ | 60 | 6-8 |
| 13 | 60 | CHCl₃ | 30 | 4 |
| 13 | 90 | CHCl₃ | 30 | 5 |
| 13 | 120 | CHCl₃ | 30 | 6 |
| 14 | 30 | CHCl₃ | 30 | 9 |
| 14 | 60 | CHCl₃ | 30 | 10 |
| 14 | 90 | CHCl₃ | 30 | 13 |
| 15 | 30 | CHCl₃ | 30 | 9 |
| 15 | 60 | CHCl₃ | 30 | 11 |
| 15 | 90 | CHCl₃ | 30 | 12 |
| 18 | 1200 | CHCl₃ | 60 | 6 |
| 19 | 30 | DMF | 120 | 12 |
| 19 | 30 | Dioxane | 180 | 12 |
| 19 | 60 | DMF | 120 | 14 |
| 16 | 20 | CHCl₃/Ethanol (2:1) | 60 | 2 |
| 16 | 30 | CHCl₃/Ethanol (2:1) | 60 | 3 |
| 23 | 5 | Toluene | 180 | 9 |
| 24 | 5 | Toluene | 180 | 10 |
| 25 | 5 | Toluene | 240 | 11 |
| 26 | 5 | Toluene | 300 | 13 |
| 27 | 600 | CHCl₃ | 15 | 3 |
| 27 | 1200 | CHCl₃ | 15 | 6 |
| 28 | 1200 | CHCl₃ | 10 | 1 |

EXAMPLE II

A solution of 0.5 g of the polymer of Example 21 in 9.5 g of N,N-dimethylformamide is applied with a 50 μm doctor blade to a copper conductor board and dried at 80° C. in the course of 5 minutes. The coating is then exposed through a Stouffer 21 step sensitivity guide for 90 seconds with a 5000 W high-pressure lamp (distance from the vacuum table 70 cm) and washed for 1 minute in chloroform. Last step reproduced=No. 5.

EXAMPLE III

A solution of 1.0 g of the polymer of Example 22 and 0.05 g of thioxanthone in 9.0 g of chloroform is applied with a 50 μm doctor blade to a copper conductor board and dried at 45° C. in the course of 3 minutes. The coating is then exposed through a Stouffer 21 step sensitivity guide for 90 seconds with a 5000 W high-pressure lamp (distance from the vacuum table 70 cm) and washed for 3 minutes in chloroform. Last step reproduced = No. 6.

EXAMPLE IV

A copper conductor board is coated with the polymer of Example 11 in the manner described in Example I. The coating is subjected to exposure for 0, 30, 60, 120 and 240 seconds. The coatings (8 samples each) are then rubbed against an uncoated copper board until the coating has been completely rubbed off. Numbers of strokes to complete abrasion of the coating = 50,000.

What is claimed is:

1. A polymer which has an average molecular weight of at least 1,000 and side groups $-S-(Y)_{n-1}-Im$ which are of the formulae Ia and/or Ib

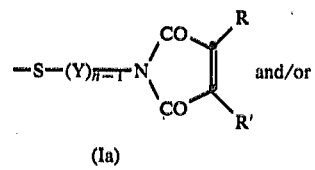

(Ia)

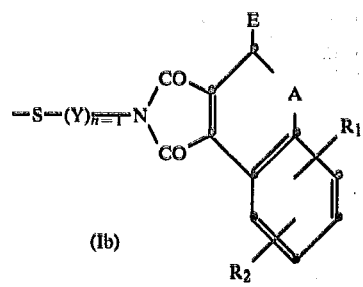

(Ib)

in which R and R′ independently of each other are $C_{1-4}$-alkyl or together are unsubstituted or methyl-substituted trimethylene or tetramethylene, $R_1$ and $R_2$ independently of each other are hydrogen, halogen, $C_{1-4}$-alkyl or methoxy, A is $-CH_2-$, $-CH_2CH_2-$ or $-OCH_2-$ where oxygen is bonded to the aromatic ring and E is hydrogen or A is $-O-$ and E is $-CH_3$, n is 1 or 2 and Y is $-C_aH_{2a}-$ where $a=1-12$, $C_{3-8}$-cycloalkylene, $C_{6-10}$-arylene, $C_{7-8}$-aralkylene or -alkylarylene or

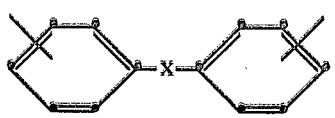

where X is a direct bond, $-O-$, $-S-$ or $-CH_2-$, and said Y substituents can also be substituted and the group of the formula Ia and/or Ib content is at least 0.5%, based on the number of the polymer's recurring structural elements, said polymer being an addition polymer prepared by incorporating a compound of the formula $Z-S-(Y)_{n-1}-Im$, where Im, n, and Y are as defined above and Z, if n=a, is halogen, and, if n=2, is hydrogen or halogen, onto a polymer having c=c double bonds, and wherein the resultant addition polymer contains recurring structural elements of the formulae

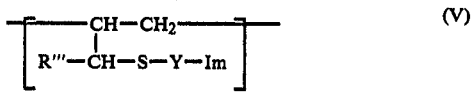 (V)

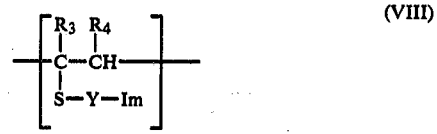 (VIII)

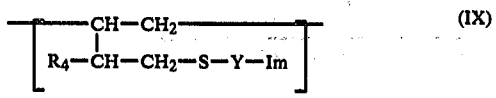 (IX)

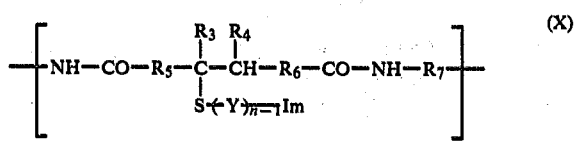 (X)

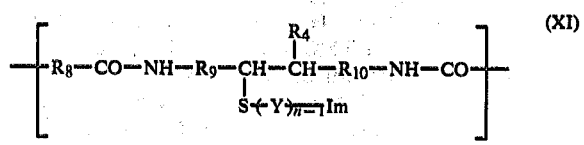 (XI)

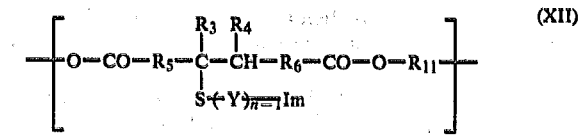 (XII)

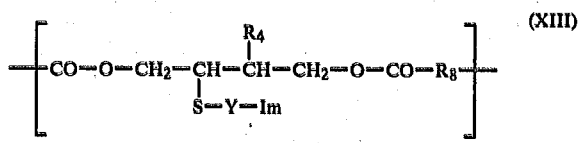 (XIII)

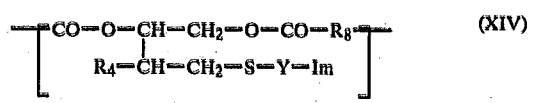 (XIV)

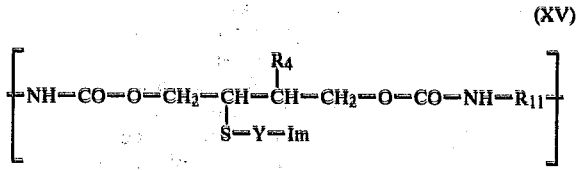 (XV)

or

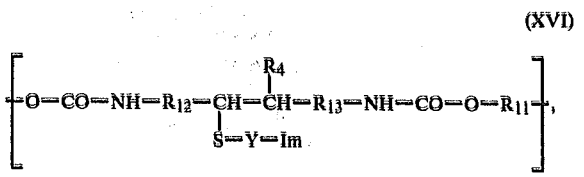 (XVI)

where R′″ is hydrogen or OH, $R_3$ is hydrogen, methyl or halogen, $R_4$ is hydrogen or halogen, $R_5$ and $R_6$ are independently a direct bond or $-CH_2-$, or one of $R_5$ and $R_6$ is a direct bond and the other is $-CH=CH-$ or $(CH_2)_8$, $R_7$ is the radical of an aromatic diamine or the radical of an aliphatic diamine which has or has not c=c double bonds and has up to 16 carbon atoms, $R_8$ is the radical of an aromatic dicarboxylic acid or the radical of an aliphatic dicarboxylic acid which has or has not c=c double bonds and containing at least 6 carbon atoms, $R_9$ and $R_{10}$ are independently substituted or unsubstituted aliphatic radicals, which have or have not c=c double bonds, and have a total of 4–12 carbon atoms in the main chains, $R_{11}$ is a benzene radical or $-C_qH_{2q}-$ where q is 2–10, and $R_{12}$ and $R_{13}$ are independently $-(CH_2)_r-$ where r is 1–5.

2. A polymer according to claim 1, in which the group of the formula Ia and/or Ib content is 5–100%, in particular 10–100%, based on the number of the polymer's recurring structural elements.

3. A polymer according to claim 1, which has side groups of the formula Ib in which A is $-CH_2-$, E, $R_1$ and $R_2$ are hydrogen, n is 2 and Y is unsubstituted or halogen-substituted $C_{2-8}$-alkylene or 1,3- or 1,4-phenylene.

4. A polymer according to claim 1, which has side groups of the formula Ib in which A is $-CH_2-$, E, $R_1$ and $R_2$ are hydrogen, n is 2 and Y is ethylene, $-CH(Cl)CH_2-$, or 1,3- or 1,4-phenylene.

5. A polymer according to claim 1, which has side groups of the formula Ia in which R and R' are methyl, n is 1 or, in particular, 2 and Y is unsubstituted or halogen-substituted $C_{2-8}$-alkylene or 1,3- or 1,4-phenylene.

6. A polymer according to claim 1, which has side groups of the formula Ia in which R and R' are methyl, n is 2 and Y is ethylene, $-CH(Cl)CH_2-$, or 1,3- or 1,4-phenylene.

7. A polymer according to claim 1, which consists of recurring structural elements of the formulae XIIa and XIIb

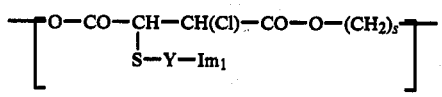

and

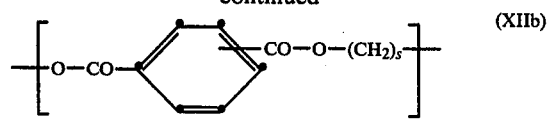

in which Y is 1,3- or 1,4-phenylene, ethylene or, in particular, $-CH(Cl)CH_2-$, $Im_1$ is a radical of the formula

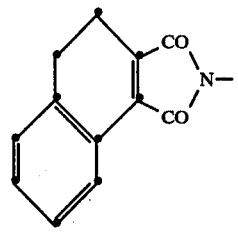

or, in particular, a radical of the formula

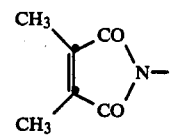

and s is a number between 2 and 12, and where the grouping

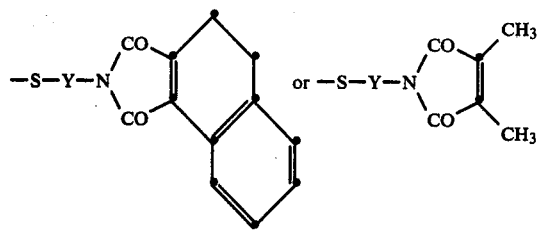

content is 60–100%, based on the number of C=C double bonds present in the starting polymer.

8. A polymer according to claim 1, which consists of recurring structural elements of the formulae XIa, XIb and/or XIc.

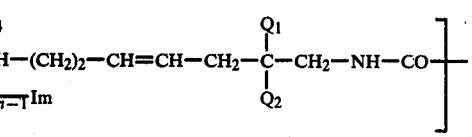

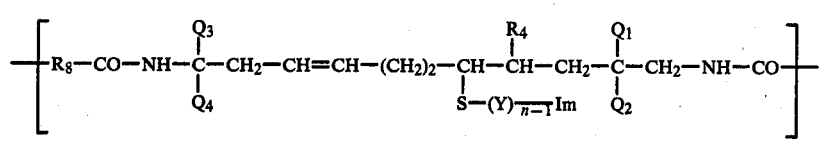

and/or

-continued

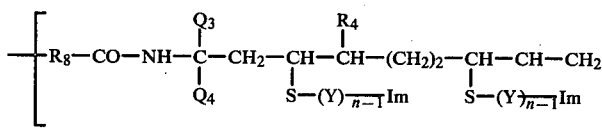
(XIc)

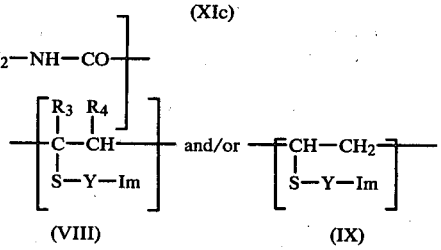
(VIII) (IX)

in which Im is a radical of the formula (A) or (B)

in which $Q_1$ is $C_{1-12}$-alkyl, $Q_2$ is hydrogen or $C_{1-12}$-alkyl, $Q_3$ is $C_{1-2}$-alkyl, cycloalkyl having 4–12 ring C atoms, aralkyl having 7 or 8 C atoms or substituted or unsubstituted aryl and $Q_4$ is hydrogen, $C_{1-12}$-alkyl, cycloalkyl having 4–12 ring C atoms, aralkyl having 7 to 8 C atoms or substituted or unsubstituted aryl or $Q_1$ and $Q_2$ and/or $Q_3$ and $Q_4$ together are alkylene having 3–11 C atoms, $R_4$ is hydrogen or halogen, in particular chlorine, $R_8$ is the radical of terephthalic acid, isophthalic acid and/or of a saturated aliphatic dicarboxylic acid having 6–12 C atoms, and Im is a radical of the formula (A) or (B)

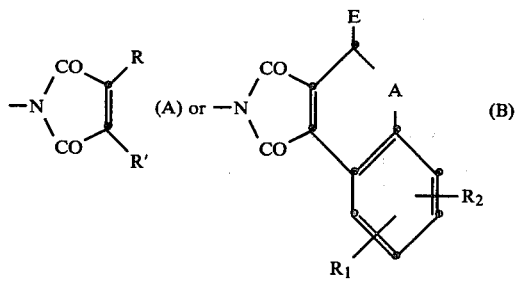

where R, R', $R_1$, $R_2$, A, E, n and Y are as defined in claim 1.

9. A polymer according to claim 8, in which $Q_1$ is methyl or ethyl, $Q_2$ is hydrogen, methyl or ethyl, $Q_3$ is $C_{1-5}$-alkyl or unsubstituted phenyl and $Q_4$ is hydrogen or methyl, $R_4$ is chlorine and $R_8$ is the radical of terephthalic acid, isophthalic acid and/or of a saturated aliphatic dicarboxylic acid having 6–10 C atoms.

10. A polymer according to claim 8, in which $Q_1$ and $Q_2$ are methyl, $Q_3$ is isopropyl, $Q_4$ is hydrogen, $R_4$ is chlorine, $R_8$ is the radical of terephthalic acid, isophthalic acid and/or adipic acid, n is 2, Y is ethylene, 1,3- or 1,4-phenylene or, in particular, —CH(Cl)CH$_2$—, and Im is a radical of the formula (B) where A=—CH$_2$— and E, $R_1$ and $R_2$=hydrogen, or especially a radical of the formula (A) where R and R'=methyl.

11. A polymer according to claim 8, in which $Q_1$ and $Q_2$ are methyl, $Q_3$ is isopropyl, $Q_4$ is hydrogen, $R_4$ is chlorine, $R_8$ is the radical of terephthalic acid and/or the radical of adipic acid, n is 2, Y is ethylene, 1,3- or 1,4-phenylene or, in particular —CH(Cl)CH$_2$—, and Im is a radical of the formula (B) where A=—CH$_2$— and E, $R_1$ and $R_2$=hydrogen, or especially a radical of the formula A where R and R'=methyl.

12. A polymer according to claim 1 which consists of recurring structural elements of the formula VIII and/or IX $R_3$ is hydrogen, methyl or halogen and $R_4$ is hydrogen or halogen and R, R', $R_1$, $R_2$, A, E and Y are as defined in claim 1.

13. A polymer according to claim 12, in which $R_3$ is hydrogen, $R_4$ is chlorine, Y is ethylene, —CH(Cl)CH$_2$— or, in particular, 1,3- or 1,4-phenylene, and Im is a radical of the formula (B) where A=CH$_2$— and E, $R_1$ and $R_2$=hydrogen or especially a radical of the formula (A) where R and R'=methyl, and where the grouping of the formula Ia or Ib content in the polymer is 60–100%, based on the number of C=C double bonds present in the starting polymer.

14. A process for preparing a polymer according to claim 1, which comprises
(a) the addition of a compound of the formula IIa or IIb

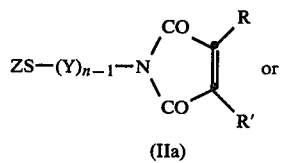
(IIa)

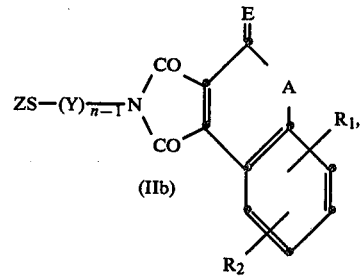
(IIb)

in which R, R', $R_1$, $R_2$, A, E, Y and n are as defined in claim 1 and Z, if n=1, is a halogen atom and, if n=2, is hydrogen or a halogen atom, onto a polymer having C=C double bonds, in such a way that the ratio of compound of the formula IIa or IIb to the number of C=C double bonds present in the starting polymer is 1:20 to 1:1.

* * * * *